United States Patent
Zhou et al.

(10) Patent No.: US 10,650,716 B2
(45) Date of Patent: May 12, 2020

(54) SHIFT REGISTER UNIT, SHIFT REGISTER, DRIVING METHOD, DISPLAY PANEL AND DISPLAY APPARATUS

(71) Applicant: Shanghai Tianma Micro-Electronics Co., Ltd., Shanghai (CN)

(72) Inventors: Yian Zhou, Shanghai (CN); Kerui Xi, Shanghai (CN); Feng Qin, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 177 days.

(21) Appl. No.: 15/826,176

(22) Filed: Nov. 29, 2017

(65) Prior Publication Data

US 2018/0090043 A1 Mar. 29, 2018

(30) Foreign Application Priority Data

Sep. 1, 2017 (CN) .......................... 2017 1 0781090

(51) Int. Cl.
*G11C 19/00* (2006.01)
*G09G 3/20* (2006.01)
*G09G 3/36* (2006.01)
*G11C 19/28* (2006.01)

(52) U.S. Cl.
CPC .............. *G09G 3/20* (2013.01); *G09G 3/3677* (2013.01); *G09G 2310/0286* (2013.01); *G09G 2310/062* (2013.01); *G09G 2320/045* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 9,495,931 B2* | 11/2016 | Chen | G09G 3/3677 |
| 9,785,271 B2* | 10/2017 | Wang | G06F 3/044 |
| 2011/0058640 A1* | 3/2011 | Shang | G11C 19/184 |
| | | | 377/64 |

(Continued)

FOREIGN PATENT DOCUMENTS

| | | |
|---|---|---|
| CN | 102148007 A | 8/2011 |
| CN | 103928001 A | 7/2014 |

(Continued)

*Primary Examiner* — Tuan T Lam
(74) *Attorney, Agent, or Firm* — Anova Law Group PLLC

(57) ABSTRACT

A gate shift register unit comprises an activation signal terminal, a deactivation signal terminal, a reset signal terminal, a first level signal terminal, a second level signal terminal, a first control terminal, a first clock signal terminal, a second clock signal terminal, an output terminal, a first node, a second node, a first node control unit, a second node control unit, a reset unit, and an output unit. The first node control unit is connected to the first control terminal, the activation signal terminal, the first level signal terminal, the second level signal terminal, the deactivation signal terminal, the first node, and the second node, and configured to transfer a signal at the first level signal terminal or the second level signal terminal to the first node under a control of potential signals at the activation signal terminal, the deactivation signal terminal, the first control terminal, and the second node.

13 Claims, 9 Drawing Sheets

(56) References Cited

U.S. PATENT DOCUMENTS

| | | | | |
|---|---|---|---|---|
| 2011/0193831 A1* | 8/2011 | Kunimori | G11C 19/184 | 345/204 |
| 2012/0068994 A1* | 3/2012 | Li | G09G 3/3677 | 345/213 |
| 2014/0062847 A1* | 3/2014 | Chien | G09G 3/3677 | 345/100 |
| 2014/0119194 A1* | 5/2014 | Raciborski | H04L 45/00 | 370/237 |
| 2014/0292628 A1* | 10/2014 | Park | G09G 3/3677 | 345/100 |
| 2015/0016584 A1* | 1/2015 | Dun | G11C 27/04 | 377/68 |
| 2015/0187320 A1* | 7/2015 | Ren | G09G 3/3696 | 345/87 |
| 2015/0213762 A1* | 7/2015 | Xia | G09G 3/3266 | 345/215 |
| 2016/0103510 A1* | 4/2016 | Liu | H03K 17/687 | 345/214 |
| 2016/0343338 A1* | 11/2016 | Gu | G09G 3/3677 | |
| 2017/0032750 A1* | 2/2017 | Shao | G09G 3/3648 | |
| 2018/0061508 A1* | 3/2018 | Chen | G09G 3/3677 | |

FOREIGN PATENT DOCUMENTS

| | | |
|---|---|---|
| CN | 104575354 A | 4/2015 |
| CN | 105845098 A | 8/2016 |

* cited by examiner

1000

SHIFT REGISTER UNIT, SHIFT REGISTER, DRIVING METHOD, DISPLAY PANEL AND DISPLAY APPARATUS

CROSS-REFERENCES TO RELATED APPLICATIONS

This application claims the priority of Chinese Patent Application No. CN201710781090.6, filed on Sep. 1, 2017, the entire contents of which are incorporated herein by reference.

FIELD OF THE DISCLOSURE

The present disclosure generally relates to the field of display technology and, more particularly, relates to the field of display panel driving technology and, in particular relates to a shift register unit, a shift register, a driving method, a display panel, and a display apparatus.

BACKGROUND

In the existing design of display panels, a pixel array, a thin-film-transistor (TFT) array, a plurality of gate lines, and a plurality of data lines intersecting and insulated from the gate lines are often configured in a display panel. Each pixel in the pixel array is connected to a data line through a TFT and is controlled by a gate line to receive a data signal.

Generally, after data of an image frame is written into the pixel array and before a next image frame is displayed, a display panel enters an image holding phase. In the image holding phase, each TFT remains turned off until a gate signal is output at the corresponding gate line when displaying the next image frame. When a TFT remains turned off for a prolonged period of time, the TFT sensitivity may be degraded. Especially in a low power consumption pull-down scanning mode (such as scanning in electronic paper), the image holding phase may be substantially long and, thus, the TFTs that remain turned off for a prolonged period of time may be subject to a characteristics drifting, causing untimely turning on or off for data input. Accordingly, the data signals may not be transmitted accurately, and the images may be displayed incorrectly.

The disclosed shift register unit, shift register, driving method, display panel and display apparatus are directed to solve one or more problems set forth above and other problems.

BRIEF SUMMARY OF THE DISCLOSURE

One aspect of the present disclosure provides a gate shift register unit, comprising an activation signal terminal and a deactivation signal terminal; a reset signal terminal; a first level signal terminal and a second level signal terminal; a first control terminal; a first clock signal terminal and a second clock signal terminal; an output terminal; a first node and a second node; a first node control unit electrically connected to the first control terminal, the activation signal terminal, the first level signal terminal, the second level signal terminal, the deactivation signal terminal, the first node, and the second node, and configured to transfer a signal at the first level signal terminal or at the second level signal terminal to the first node under a control of potential signals at the activation signal terminal, the deactivation signal terminal, the first control terminal, and the second node; a second node control unit electrically connected to the second level signal terminal, the second clock signal terminal, the first node, and the second node, and configured to transfer a signal at the second level signal terminal or at the second clock signal terminal to the second node under a control of a potential signal at the first node; a reset unit electrically connected to the reset signal terminal, the second level signal terminal, the first node, and the output terminal, and configured to reset signals at the first node and the output terminal under a control of a potential signal at the reset signal terminal; and an output unit electrically connected to the first clock signal terminal, the second clock signal terminal, the second level signal terminal, the first node, the second node, and the output terminal, and configured to transfer a signal at the first level signal terminal, the second level signal terminal, or the second clock signal terminal to the output terminal under a control of the first clock signal terminal, the first node, and the second node.

Another aspect of the present disclosure provides a driving method for a gate shift register unit, comprising an activation signal terminal and a deactivation signal terminal, a reset signal terminal, a first level signal terminal and a second level signal terminal, a first control terminal, a first clock signal terminal and a second clock signal terminal, an output terminal, a first node and a second node, a first node control unit electrically connected to the first control terminal, the activation signal terminal, the first level signal terminal, the second level signal terminal, the deactivation signal terminal, the first node, and the second node, and configured to transfer a signal at the first level signal terminal or at the second level signal terminal to the first node under a control of potential signals at the activation signal terminal, the deactivation signal terminal, the first control terminal, and the second node, a second node control unit electrically connected to the second level signal terminal, the second clock signal terminal, the first node, and the second node, and configured to transfer a signal at the second level signal terminal or at the second clock signal terminal to the second node under a control of a potential signal at the first node, a reset unit electrically connected to the reset signal terminal, the second level signal terminal, the first node, and the output terminal, and configured to reset signals at the first node and the output terminal under a control of a potential signal at the reset signal terminal, and an output unit electrically connected to the first clock signal terminal, the second clock signal terminal, the second level signal terminal, the first node, the second node, and the output terminal, and configured to transfer a signal at the first level signal terminal, the second level signal terminal, or the second clock signal terminal to the output terminal under a control of the first clock signal terminal, the first node, and the second node. An operation timing sequence of the gate shift register unit includes a data writing phase and an image holding phase. At the data writing phase, a single pulse trigger signal is supplied to the activation signal terminal, a first clock signal is supplied to the first clock signal terminal, a second clock signal is supplied to the second clock signal terminal, a first level signal is supplied to the first level signal terminal, a second level signal is supplied to the second level signal terminal, a second level signal is supplied to the first control terminal, the output terminal of the gate shift register unit outputs a scanning driving signal, and a half first clock signal cycle delay exists between the first clock signal and the second clock signal. At the image holding phase, a pulse signal is supplied to the first control terminal, another pulse signal is supplied sequentially to the first clock signal terminal and the second clock signal terminal, a first level signal is supplied to the first level signal terminal, a second level signal is supplied to the second level signal terminal, and the output terminal of the gate shift register unit outputs a single pulse signal.

Another aspect of the present disclosure provides a gate shift register, comprising a first stage to an N-th stage cascaded gate shift register units, where N is a positive integer greater than 1, and each gate shift register unit comprises an activation signal terminal and a deactivation signal terminal, a reset signal terminal, a first level signal terminal and a second level signal terminal, a first control terminal, a first clock signal terminal and a second clock signal terminal, an output terminal, a first node and a second node, a first node control unit electrically connected to the first control terminal, the activation signal terminal, the first level signal terminal, the second level signal terminal, the deactivation signal terminal, the first node, and the second node, and configured to transfer a signal at the first level signal terminal or at the second level signal terminal to the first node under a control of potential signals at the activation signal terminal, the deactivation signal terminal, the first control terminal, and the second node, a second node control unit electrically connected to the second level signal terminal, the second clock signal terminal, the first node, and the second node, and configured to transfer a signal at the second level signal terminal or at the second clock signal terminal to the second node under a control of a potential signal at the first node, a reset unit electrically connected to the reset signal terminal, the second level signal terminal, the first node, and the output terminal, and configured to reset signals at the first node and the output terminal under a control of a potential signal at the reset signal terminal, and an output unit electrically connected to the first clock signal terminal, the second clock signal terminal, the second level signal terminal, the first node, the second node, and the output terminal, and configured to transfer a signal at the first level signal terminal, the second level signal terminal, or the second clock signal terminal to the output terminal under a control of the first clock signal terminal, the first node, and the second node.

Another aspect of the present disclosure provides a driving method for the disclosed gate shift register. An operation timing sequence of the gate shift register includes a data writing phase and an image holding phase. At the data writing phase, a single pulse trigger signal is supplied to the trigger signal line, a third clock signal is supplied to the first clock signal line, a fourth clock signal is supplied to the second clock signal line, a first level signal is supplied to the first level signal line, a second level signal is supplied to the second level signal line, each gate shift register unit sequentially outputs a single pulse scanning driving signal, and a half third clock signal cycle delay exists between the third clock signal and the fourth clock signal. At the image holding phase, a single pulse reset signal is supplied sequentially to the first reset signal line and the second reset signal line, a first level signal is supplied to the first level signal terminal, a second level signal is supplied to the second level signal terminal, a clock signal is supplied to the control signal line, a single pulse clock signal is supplied sequentially to first clock signal line and the second clock signal line, and each of the odd-numbered stage gate shift register units and each of the even-numbered stage gate shift register units sequentially output a single pulse driving signal.

Another aspect of the present disclosure provides a display panel, comprising a plurality of scanning lines and the disclosed gate shift register. The plurality of scanning lines are one-to-one corresponding electrically connected to the plurality of gate shift register units in the gate shift register.

Another aspect of the present disclosure provides a display apparatus, comprising the disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 8b illustrates a timing diagram of the exemplary display panel shown in FIG. 8a;

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present disclosure and not to limit the present disclosure. In addition, it should also be noted that, for ease of description, only part, but not all, of the structures associated with the present disclosure are shown in the accompanying drawings. Other embodiments obtained by those skilled in the art without making creative work are within the scope of the present disclosure.

Figure 1:
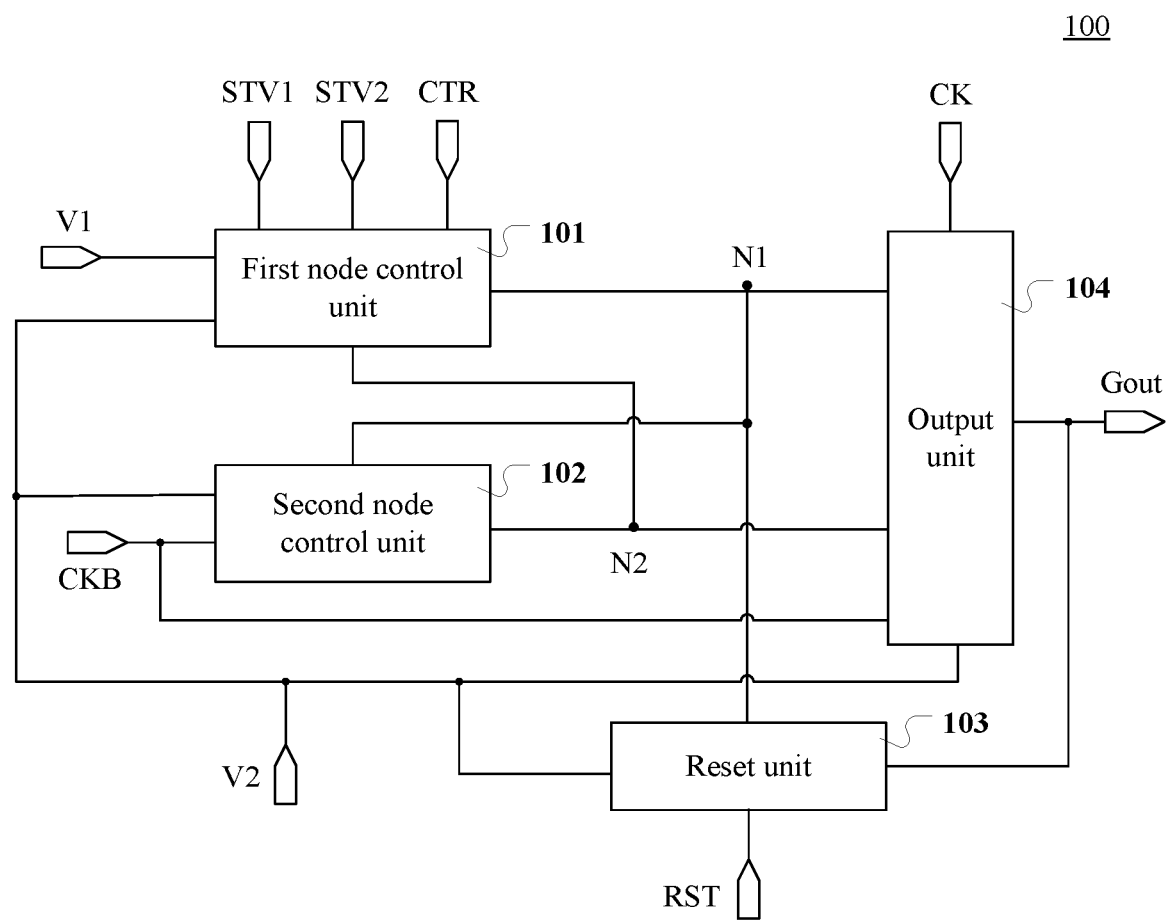
FIG. 1 illustrates a schematic view of an exemplary gate shift register unit according to the disclosed embodiments.

FIG. 1 illustrates a schematic view of an exemplary gate shift register unit 100 according to the disclosed embodiments. As shown in FIG. 1, the gate shift register unit 100 may include an activation signal terminal STV1, a deactivation signal terminal STV2, a reset signal terminal RST, a first level signal terminal V1, a second level signal terminal V2, a first control terminal CTR, a first clock signal terminal CK, a second clock signal terminal CKB, an output terminal Gout, a first node N1, a second node N2, a first node control unit 101, a second node control unit 102, a reset unit 103, and an output unit 104.

The first node control unit 101 may be electrically connected to the first control terminal CTR, the activation signal terminal STV1, the first level signal terminal V1, the second level signal terminal V2, the deactivation signal terminal STV2, the first node N1, and the second node N2. The first node control unit 101 may be configured to transfer signals from the first level signal terminal V1 or the second level signal terminal V2 to the first node N1 under the control of potential signals at the activation signal terminal STV1, the deactivation signal terminal STV2, the first control terminal CTR, and the second node N2. Further, the activation signal terminal STV1 may be configured to control the gate shift register unit 100 to activate/enable the signal shifting function, while the deactivation signal terminal STV2 may be configured to control the gate shift register unit 100 to deactivate/disable the signal shifting function.

In particular, when the signal shifting function of the gate shift register unit 100 is enabled, the first node control unit 101 may transfer a signal at the first level signal terminal V1 to the first node N1 under the control of the activation signal terminal STV1. When the signal shifting function of the gate shift register unit 100 is disabled, the first node control unit 101 may transfer a signal at the second level signal terminal V2 to the first node N1 under the control of the deactivation signal terminal STV2. Further, under the control of the first control terminal CTR, the first node control unit 101 may also transfer a signal at the first level signal terminal V1 to the first node N1, to control the gate shift register unit 100 to output a turn-on signal.

The second node control unit 102 may be electrically connected to the second level signal terminal V2, the second clock signal terminal CKB, the first node N1, and the second node N2. The second node control unit 102 may be configured to transfer a signal at the second level signal terminal V2 or at the second clock signal terminal CKB to the second node N2, under the control of an potential signal at the first node N1.

The reset unit 103 may be electrically connected to the reset signal terminal RST, the second level signal terminal V2, the first node N1, and the output terminal Gout. The reset unit 103 may be configured to reset signals at the first node N1 and at the output terminal Gout, under the control of the reset signal terminal RST.

The output unit 104 may be electrically connected to the first clock signal terminal CK, the second clock signal terminal CKB, the second level signal terminal V2, the first node N1, the second node N2, and the output terminal Gout. The output unit 104 may be configured to transfer a signal at the first level signal terminal V1, the second level signal terminal V2, or the second clock signal terminal CKB to the output terminal Gout, under the control of the first clock signal terminal CK, the first node N1, and the second node N2.

In one embodiment, the output unit 104 may output a signal at the second clock signal terminal CKB and a signal at the second level signal terminal V2 to the output terminal Gout under the control of level signals at the first node N1 and the second node N2, respectively. Thus, alternate current signals may be output by the output unit 104 under the control of the first node N1 and the second mode N2. In addition to being controlled by the activation signal terminal STV1 and the deactivation signal terminal STV2, the potential signal at the first node N1 may also be controlled by the first control terminal CTR. Accordingly, the output unit 104 may output the alternate current signal under the control of the first control terminal CTR.

In particular, when driving the gate shift register unit 100, in a data writing phase, the activation signal terminal STV1 and the deactivation signal terminal STV2 may control the potential signal at the first node N1, respectively. At the image holding phase, to prevent the image quality from being degraded by the interferences on the data lines and to reduce power consumption, the activation signal terminal STV1 and the deactivation signal terminal STV2 may not control the potential at the first node N1. Accordingly, the first control terminal CTR may control the potential signal at the first node N1 to make the output unit 104 output the alternate current signal, such that the scanning lines that are electrically connected to the shift register unit 100 may output signals to turn on the TFT array, which may prevent the TFT array from being turned off for a prolonged period of time in the image holding phase. Accordingly, a characteristics drifting of the TFT array may be suppressed.

In the disclosed embodiments, the shift register unit 100 may control the potential at the first node N1 by the first control terminal CTR. Thus, not only the signal shifting function of the existing shift register unit 100 may be achieved, but also the shift register unit 100 may output the alternate current signal in the image holding phase, which may be realized by introducing the first control terminal CTR to the existing shift register unit and configuring the first control terminal CTR to control the level signal transfer to the first node N1. Further, the IC control logic may be simplified, and the power consumption may be reduced.

Figure 2:
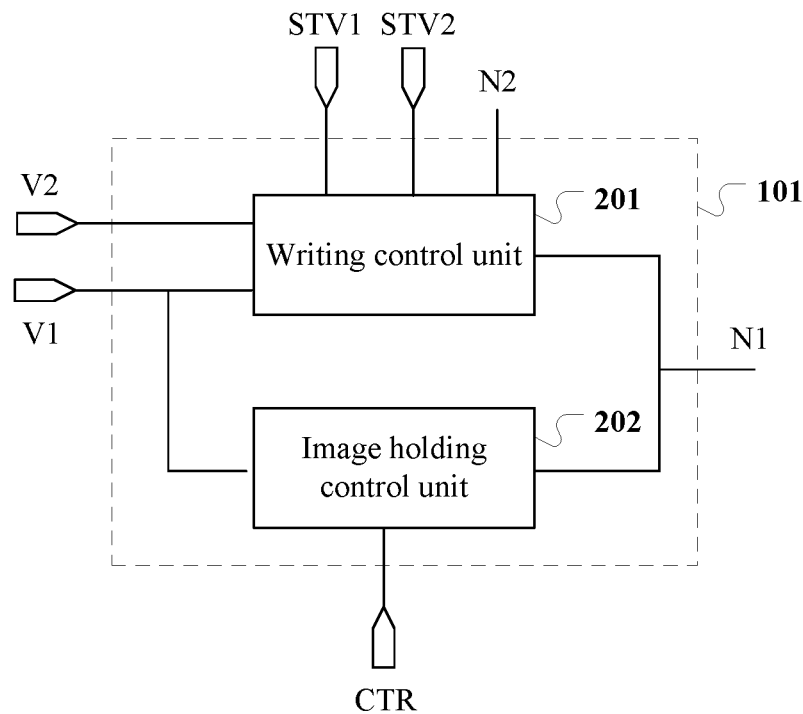
FIG. 2 illustrates a schematic view of a first node control unit in an exemplary gate shift register unit according to the disclosed embodiments.

FIG. 2 illustrates a schematic view of a first node control unit in an exemplary gate shift register unit according to the present disclosure.

As shown in FIG. 2, the first node control unit 101 may include a writing control unit 201 and an image holding control unit 202. The writing control unit 201 may be electrically connected to the activation signal terminal STV1, the deactivation signal terminal STV2, the first level signal terminal V1, the second level signal terminal V2, the second node N2, and the first node N1. The writing control unit 201 may be configured to transfer a signal at the first level signal terminal V1 to the first node N1 under the control of the activation signal terminal STV1 in the data writing phase, and configured to transfer a signal at the second level signal terminal V2 to the first node N1 under the control of the deactivation signal terminal STV2 and the second node N2.

The image holding control unit 202 may be electrically connected to the first level signal terminal V1, the first control terminal CTR, and the first node N1. At the image holding phase, the image holding control unit 202 may be configured to transfer a signal at the first level signal terminal V1 to the first node N1 under the control of the first control terminal CTR.

Further, at the image holding phase, the writing control unit 201 may disconnect the first level signal terminal V1 from the first node N1 under the control of the deactivation signal terminal STV2. At the data writing phase, the image holding control unit 202 may be electrically disconnected from the first node N1 under the control of the first control terminal CTR. Accordingly, the writing control unit 201 and the image holding control unit 202 may control the potential signal at the first node N1 at the data writing phase and the image holding phase, respectively. Thus, the first node N1 may be able to have the same potential signal at the image holding phase as at the data writing phase, thereby controlling the output unit to output a turned-on signal.

In the disclosed embodiments, the writing control unit 201 may use a circuit in a sub-module of the existing shift register unit for controlling the potential at the first node N1 in the data writing phase. The image holding control unit 202 may use a circuit in which the turning-on or turning-off is controlled by the first control terminal CTR.

As shown in FIG. 2, in the shift register unit, through introducing the image holding control unit 201 to the first node control unit 101 for controlling the potential signal at the first node N1 at the image holding phase, the output of the output unit at the image holding phase may be controlled by a simple circuit. That is, at the image holding phase, the output unit may output a signal to turn on the TFT that is electrically connected to the shift register unit. Thus, at the image holding phase, the TFT may be prevented from being turned off for a prolonged period of time, the corresponding characteristics drifting may be suppressed, and the lifespan of the TFT may not be affected.

Figure 3:
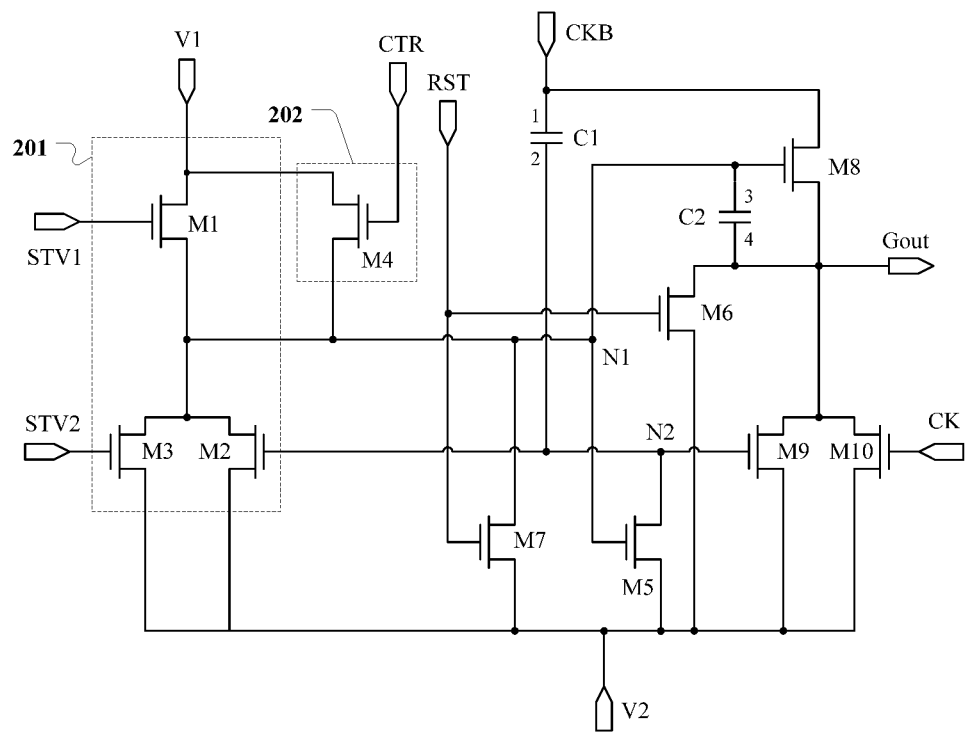
FIG. 3 illustrates a circuit diagram of an exemplary gate shift register unit according to the disclosed embodiments.

FIG. 3 illustrates a schematic circuit diagram of an exemplary gate shift register unit according to the present disclosure.

As shown in FIG. 3, the writing control unit 201 may include a first transistor M1, a second transistor M2, and a third transistor M3. A gate electrode of the first transistor M1 may be electrically connected to the activation signal terminal STV1. A first electrode of the first transistor M1 may be electrically connected to the first level signal terminal V1. A second electrode of the first transistor M1 may be electrically connected to the first node N1. A gate electrode of the second transistor M2 may be electrically connected to the second node N2. A first electrode of the second transistor M2 may be electrically connected to the second level signal terminal V2. A second electrode of the second transistor M2 may be electrically connected to first node N1. A gate electrode of the third transistor M3 may be electrically connected to the deactivation signal terminal STV2. A first electrode of the third transistor M3 may be electrically connected to the second level signal terminal V2. A second electrode of the third transistor M3 may be electrically connected to the first node N1.

As shown in FIG. 3, the first transistor M1, the second transistor M2, and the third transistor M3 may be respectively controlled by the activation signal terminal STV1, the second node N2, and the deactivation signal terminal STV2 to turn on or off. The first transistor M1 may be configured to transfer the signal at the first level signal terminal V1. The second transistor M2 and the third transistor M3 may be configured to transfer the signal at the second node N2. The first level signal terminal V1 and the second level signal terminal V2 may be provided by signals having opposite polarities. Thus, the first transistor M1, the second transistor M2, and the third transistor M3 may control the first node N1 to output an alternate current signal.

Further, the image holding control unit 202 may include a fourth transistor M4. A gate electrode of the fourth transistor M4 may be electrically connected to the first control terminal CTR. A first electrode of the fourth transistor M4 may be electrically connected to the first level signal terminal V1. A second electrode of the fourth transistor M4 may be electrically connected to the first node N1. The fourth transistor M4 may be controlled by the first control terminal CTR to turn on or off. When the fourth transistor M4 is turned on, the signal at the first level signal terminal V1 may be transferred to the first node N1.

Further, the second node control unit 102 may include a fifth transistor M5 and a first capacitor C1. A gate electrode of the fifth transistor M5 may be electrically connected to the first node N1. A first electrode of the fifth transistor M5 may be electrically connected to the second level signal terminal V2. A second electrode of the fifth transistor M5 may be electrically connected to the second node N2. The first capacitor C1 may include a first electrode plate 1 and a second electrode plate 2. The first electrode plate 1 of the first capacitor C1 may be electrically connected to the second clock signal terminal CKB. The second electrode plate 2 of the first capacitor C1 may be electrically connected to the second node N2.

As shown in FIG. 3, the fifth transistor M5 may be controlled by the potential signal at the first node N1. When the first node N1 receives a potential signal from the first level signal terminal V1 to turn on the fifth transistor M5, the potential signal at the second level signal terminal V2 may be transferred to the second node N2, thereby making the potential signals at the first node N1 and the second node N2 have opposite polarities. When the second node N2 is floated, the first capacitor C1 may couple the signal at the second clock signal terminal CKB, which has the same polarity as the signal at the first level signal terminal V1, to the second node N2, thereby achieving the control of the second node N2 having different level signals.

Further, the reset unit 103 may include a sixth transistor M6 and a seventh transistor M7. A gate electrode of the sixth transistor M6 may be electrically connected to the reset signal terminal RST. A first electrode of the sixth transistor M6 may be electrically connected to the second level signal terminal V2. A second electrode of the sixth transistor M6 may be electrically connected to the output terminal Gout. A gate electrode of the seventh transistor M7 may be electrically connected to the reset signal terminal RST. A first electrode of the seventh transistor M7 may be electrically connected to the second level signal terminal V2. A second electrode of the seventh transistor M7 may be electrically connected to the first node N1.

The reset unit 103 may be configured to reset signals at the output terminal Gout and the first node N1. Specifically, the reset unit 103 may set the signals at the first node N1 and the output terminal Gout to the signal at the second level signal terminal V2.

Further, the output unit 104 may include an eighth transistor M8, a ninth transistor M9, a tenth transistor M10, and a second capacitor C2. A gate electrode of the eighth transistor M8 may be electrically connected to the first node N1. A first electrode of the eighth transistor M8 may be electrically connected to the second clock signal terminal CKB. A second electrode of the eighth transistor M8 may be electrically connected to the output terminal Gout. A gate electrode of the ninth transistor M9 may be electrically connected to the second node N2. A first electrode of the ninth transistor M9 may be electrically connected to the second level signal terminal V2. A second electrode of the ninth transistor M9 may be electrically connected to the output terminal Gout. A gate electrode of the tenth transistor M10 may be electrically connected to the first clock signal terminal CK. A first electrode of the tenth transistor M10 may be electrically connected to the second level signal terminal V2. A second electrode of the tenth transistor M10 may be electrically connected to the output terminal Gout. The second capacitor C2 may include a third electrode plate 3 and a fourth electrode plate 4. The third electrode plate 3 of the second capacitor C2 may be electrically connected to the first node N1. The fourth electrode plate 4 of the second capacitor C2 may be electrically connected to the output terminal Gout.

The eighth transistor M8 and the ninth transistor M9 may be respectively controlled by the level signals at the first node N1 and the second node N2, and may respectively transfer the signals at the second clock signal terminal CKB and the second level signal terminal V2 to the output terminal Gout. The second capacitor C2 may be configured to store the potential at the first node N1. The tenth transistor M10 may be configured to reset the signal at the output terminal Gout under the control of the first clock signal terminal CK.

Further, the second transistor M2 may have a same channel type as the fifth transistor M5, the eighth transistor M8, and the ninth transistor M9. For example, the transistors may be N-type transistors or P-type transistors. Thus, the first node N1 and the second node N2 may not output the signals to turn on the eighth transistor M8 and the ninth transistor M9 at the same time. Thus, inaccurate and unstable signals at the output terminal Gout, which are caused by the potential racing between the second electrode of the eighth transistor M8 and the second electrode of the ninth transistor M9, may be prevented.

In certain embodiments, the sixth transistor M6 and the seventh transistor M7 may have the same channel type. For example, the transistors may be N-type transistors or P-type transistors, thereby ensuring that the reset signal terminal RST may simultaneously reset the level signals at the first node N1 and the output terminal Gout.

In certain other embodiments, the sixth transistor M6 and the seventh transistor M7 may have different channel types and, accordingly, the reset signal terminal RST may reset the level signals at the first node N1 and the output terminal Gout in a time divisional manner.

In one embodiment, the transistors M1 through M10 may have s same channel type. For example, as shown in FIG. 3, the transistors M1 through M10 may be N-type transistors.

As shown in FIG. 3, the fourth transistor M4 may be controlled by the first control terminal CTR. The first electrode and the second electrode of the fourth transistor M4 may be electrically connected to the first level signal terminal V1 and the first node N1, respectively. After the data writing phase ends (i.e., after the output terminal Gout outputs the shift signal), the first node N1 may maintain the potential of the second level signal terminal V2. In the image holding phase, the fourth transistor M4 may be controlled by the first control terminal CTR to transfer a signal at the first level signal terminal V1 to the first node N1, thereby changing the potential at the first node N1, and, further enabling the output unit to output an alternate current signal in the image holding phase. Thus, the characteristics drifting of the TFT may be prevented effectively. Especially in display modules or application scenarios with pull-down and low power consumption scan, and long image holding phase, such as electrophoretic display panels, the performance of the TFTs may be stabilized, and the image performance of the display panel may be enhanced.

The present disclosure also provides a driving method for the shift register unit, where the operation timing sequence of the shift register unit may include a data writing phase and an image holding phase.

At the data writing phase, a single pulse trigger signal may be supplied to the activation signal terminal STV1. A first clock signal may be supplied to the first clock signal terminal CK. A second clock signal may be supplied to the second clock signal terminal CKB. A first level signal may be supplied to the first level signal terminal V1. A second level signal may be supplied to the second level signal terminal V2. The gate shift register unit may output a scanning driving signal at the output terminal Gout. A half first clock cycle delay may exist between the first clock signal and the second clock signal. The first level signal and the second level signals may have different potentials. In one embodiment, the first level signal may turn on the TFTs in the gate shift register unit, and the second level signal may turn off the TFTs in the gate shift register unit. In another embodiment, the second level signal may turn on the TFTs in the gate shift register unit, and the first level signal may turn off the TFTs in the gate shift register unit. The first level signal and the second level signal may be a high level signal and a low level signal, respectively. In the present disclosure, the high level signal and the low level signal only represents a relative relationship of the level signals, and are not intended to limit the scope of the present disclosure.

At the image holding phase, a pulse signal may be supplied to the first control terminal CTR. Pulse signals may be supplied to the first clock signal terminal CK and the second clock signal terminal CKB sequentially. A first level signal may be supplied to the first level signal terminal V1. A second level signal may be supplied to the second level signal terminal V2. The gate shift register unit may output a single pulse signal at the output terminal Gout.

Figure 4:
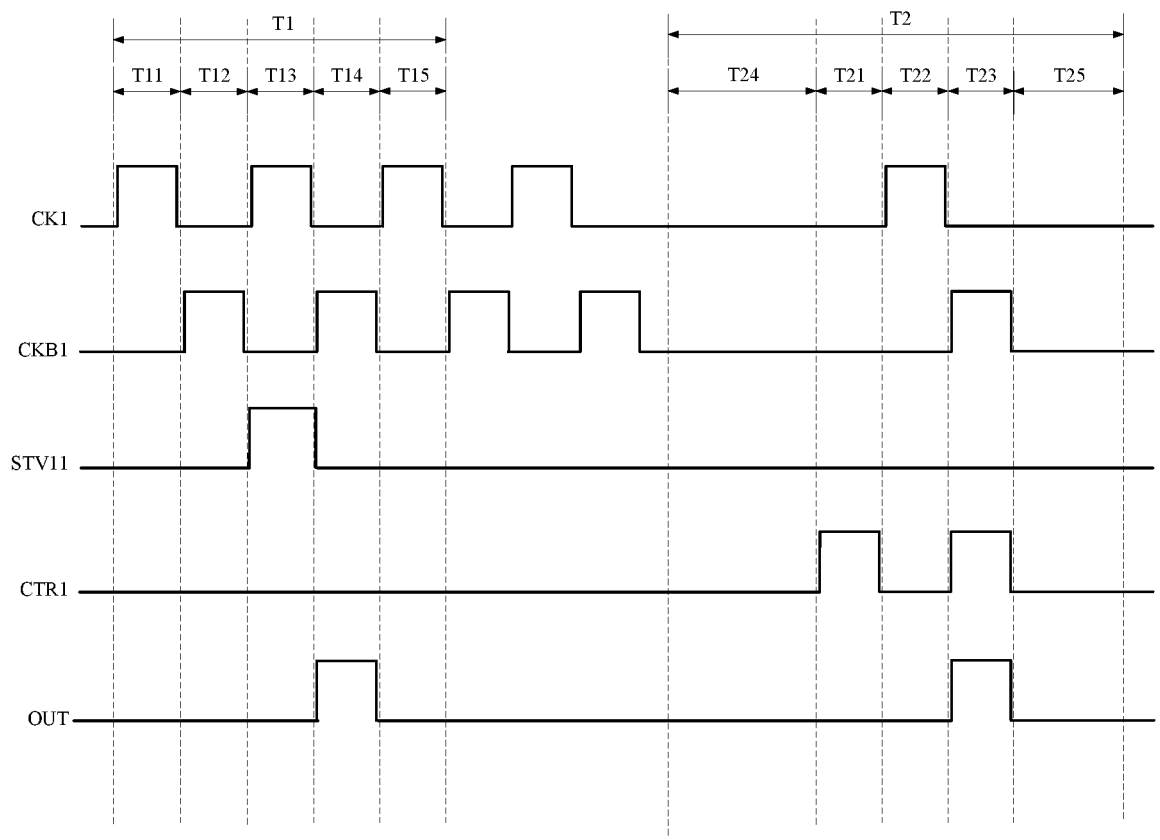
FIG. 4 illustrates a timing diagram of the exemplary gate shift register unit shown in FIG. 3.

FIG. 4 illustrates a schematic timing diagram of the exemplary gate shift register unit shown in FIG. 3. CK1, CKB1, STV11, CTR1, OUT may represent the signals at the first clock signal terminal CK, the second clock signal terminal CKB, the activation signal terminal STV1, the first control terminal CTR, and the output terminal Gout. The operation principle of the gate shift register unit shown in FIG. 3 driven by the driving method described above may be further explained with the accompanying FIG. 4. In one embodiment, the transistors may be N-type transistors. The first level signal may be a high level signal, i.e., a signal to turn on a transistor. The second level signal may be a low level signal, i.e., a signal to turn off a transistor.

As shown in FIG. 4, at the data writing phase T1, a single pulse signal STV11 may be supplied to the activation signal terminal STV1. A first clock signal CK1 may be supplied to the first clock signal terminal CK. A second clock signal CKB1 may be supplied to the second clock signal terminal CKB. A first level signal of constant voltage (not shown in FIG. 4) may be supplied to the first level signal terminal V1. A second level signal of constant voltage (not shown in FIG. 4) may be supplied to the second level signal terminal V2.

The data writing phase T1 may include a first writing phase T11, a second writing phase T12, a third writing phase T13, a fourth writing phase T14, and a fifth writing phase T15.

In particular, at the first writing phase T11, a high level signal (CK1 is high level signal) may be supplied to the first clock signal terminal CK. A low level signal (CKB1, STV11, CTR1 are low level) may be supplied to the second clock signal terminal CKB, the activation signal terminal STV1, and the first control terminal CTR. The tenth transistor M10 may be turned on to transfer a low level signal at the second level signal terminal V2 to the output terminal Gout. The output terminal Gout may output a low level signal (OUT is low level).

At the second writing phase T12, a low level signal (CK1, STV11, CTR1 are low level) may be supplied to the first clock signal terminal CK, the activation signal terminal STV1, and the first control terminal CTR. A high level signal (CKB1 is high level) may be supplied to the second clock signal terminal CKB. Due to the coupling effect of the first capacitor C1, the potential at the second node N2 may be raised to turn on the second transistor M2 and the ninth transistor M9. The low level signal at the second level signal terminal V2 may be transferred to the first node N1 and the output terminal Gout. The first node may have a low level. The output terminal Gout may output a low level signal (OUT is low level).

At the third writing phase T13, a high level signal (CK1 and STV11 are high level) may be supplied to the first clock signal terminal CK and the activation signal terminal STV1. A low level signal (CKB1 and CTR1 are low level) may be supplied to the second clock signal terminal CKB and the first control terminal CTR. The first transistor M1 may be turned on to transfer a high level signal at the first level signal terminal V1 to the first node N1. Subsequently, the fifth transistor M5 may be turned on to transfer a low level signal at the second level signal terminal V2 to the second node N2. The eighth transistor M8 may be turned on to transfer a low level signal at the second clock signal terminal CKB to the output terminal Gout. Then the third electrode plate 3 of the second capacitor C2 may have a high level, and the fourth electrode plate 4 of the second capacitor C2 may have a low level. The second capacitor C2 may store electric charges to maintain a potential difference between the first node N1 and the output terminal Gout.

At the fourth writing phase T14, a low level signal (CK1, STV11, and CTR1 are low level) may be supplied to the first clock signal terminal CK, the activation signal terminal STV1, and the first control terminal CTR. A high level signal (CKB1 is high v) may be supplied to the second clock signal terminal CKB. The first node may be floated, and the second capacitor C2 may discharge to raise the potential at the first node N1. The eighth transistor M8 may remain turned on to transfer a high level signal at the second clock signal terminal CKB to the output terminal Gout. The output terminal Gout may output a high level signal (OUT is high level).

At the fifth writing phase T15, a high level signal (CK1 is high level) may be supplied to the first clock signal terminal CK. A low level signal (CKB1, STV11, and CTR1 are low level) may be supplied to the second clock signal terminal CKB, the activation signal terminal STV1, and the first control terminal CTR. Then the tenth transistor M10 may be turned on to transfer a low level signal at the second level signal terminal V2 to the output terminal Gout. The output terminal Gout may output a low level signal (OUT is low level).

The image holding phase T2 may include a first holding phase T21, a second holding phase T22, and a third holding phase T23.

Specifically, at the first holding phase, a low level signal (CK1, CKB1, and STV11 are low level) may be supplied to the first clock signal terminal CK, the second clock signal terminal CKB, and the activation signal terminal STV1. A high level signal (CTR1 is high level) may be supplied to the first control terminal CTR. The fourth transistor M4 may be turned on to transfer a high level signal at the first level signal terminal V1 to the first node N1. The fifth transistor M5 may be turned on to transfer a low level signal at the second level signal terminal V2 to the second node N2. The eighth transistor M8 may be turned on to transfer a low level signal at the second clock signal terminal CKB to the output terminal Gout. A potential difference between the first node N1 and the output terminal Gout may be maintained by the second capacitor C2. The output terminal Gout may output a low level signal (OUT is low level).

At the second holding phase T22, a high level signal (CK1 is high level) may be supplied to the first clock signal terminal CK. A low level signal (CKB1, STV11, and CTR1 are low level) may be supplied to the second clock signal terminal CKB, the activation signal terminal STV1, and the first control terminal CTR. The tenth transistor M10 may be turned on to transfer a low level signal at the second level signal terminal V2 to the output terminal Gout. The second capacitor C2 may discharge to raise the potential at the first node N1. The eighth transistor M8 may be turned on to transfer a low level signal at the second clock signal terminal CKB to the output terminal Gout. The output terminal Gout may output a low level signal (OUT is low level).

At the third holding phase T23, a high level signal (CKB1 and CTR1 are high level) may be supplied to the second clock signal terminal CKB and the first control terminal CTR. A low level signal (CK1 and STV11 are low level) may be supplied to the first clock signal terminal CK and the activation signal terminal STV1. The first node N1 may maintain a high level. The eighth transistor M8 may be turned on to transfer a high level signal at the second clock signal terminal CKB to the output terminal Gout. The output terminal gout may output a high level signal (OUT is high level).

The image holding phase T2 may also include other phases (e.g., T24, T25, etc.), in which a low level signal (CK1, CKB1, STV11, and CTR1 are low level) may be supplied to the first clock signal terminal CK, the second clock signal terminal CKB, the activation signal terminal STV1, and the first control terminal CTR. The output terminal Gout may continue to output a low level signal (OUT is low level).

As shown in FIG. 4, in the image holding phase, the output terminal Gout of the gate shift register unit may output a single pulse signal (OUT is a single pulse signal in the image holding phase). Thus, the scanning line electrically connected to the gate shift register unit may transmit a turn-on signal to the TFT in the image holding phase, thereby switching the TFT electrically connected to the pixel from a turn-off state to a turn-on state, as well as, from a turn-on state to a turn-off state in the image holding phase. Thus, the characteristics drifting of the TFT may be avoided.

It should be noted that FIG. 4 only illustrates an operation timing sequence that the output terminal Gout outputs a single pulse signal in the image holding phase. In practical applications, based on a time threshold that a TFT remains in a turn-off state may cause characteristics drift, and a length of the image holding phase, the operation timing sequence of the driving method executed in the image holding phase including the first holding phase T21, the second holding phase T22, and the third holding phase T23 may be designed to include a plurality of repetitions.

For example, when the length of the image holding phase is t10, the time threshold that the TFT remains in the turn-off state triggering a characteristics drift is t20. When *t20≤t10≤ (n+1)*t20, and n is a positive integer, the output terminal may have to output at least n number of pulse signals in the image holding phase t10. That is, the driving method may execute the operation timing sequence including T21-T23 shown in FIG. 4 for n number of times.

The present disclosure also provides a gate shift register, including a first stage gate shift register unit to N-th stage gate shift register unit according to the disclosed embodiments. The first stage gate shift register unit to the N-th stage gate shift register unit may be cascaded sequentially. N is positive integer greater than 1.

Figure 5:
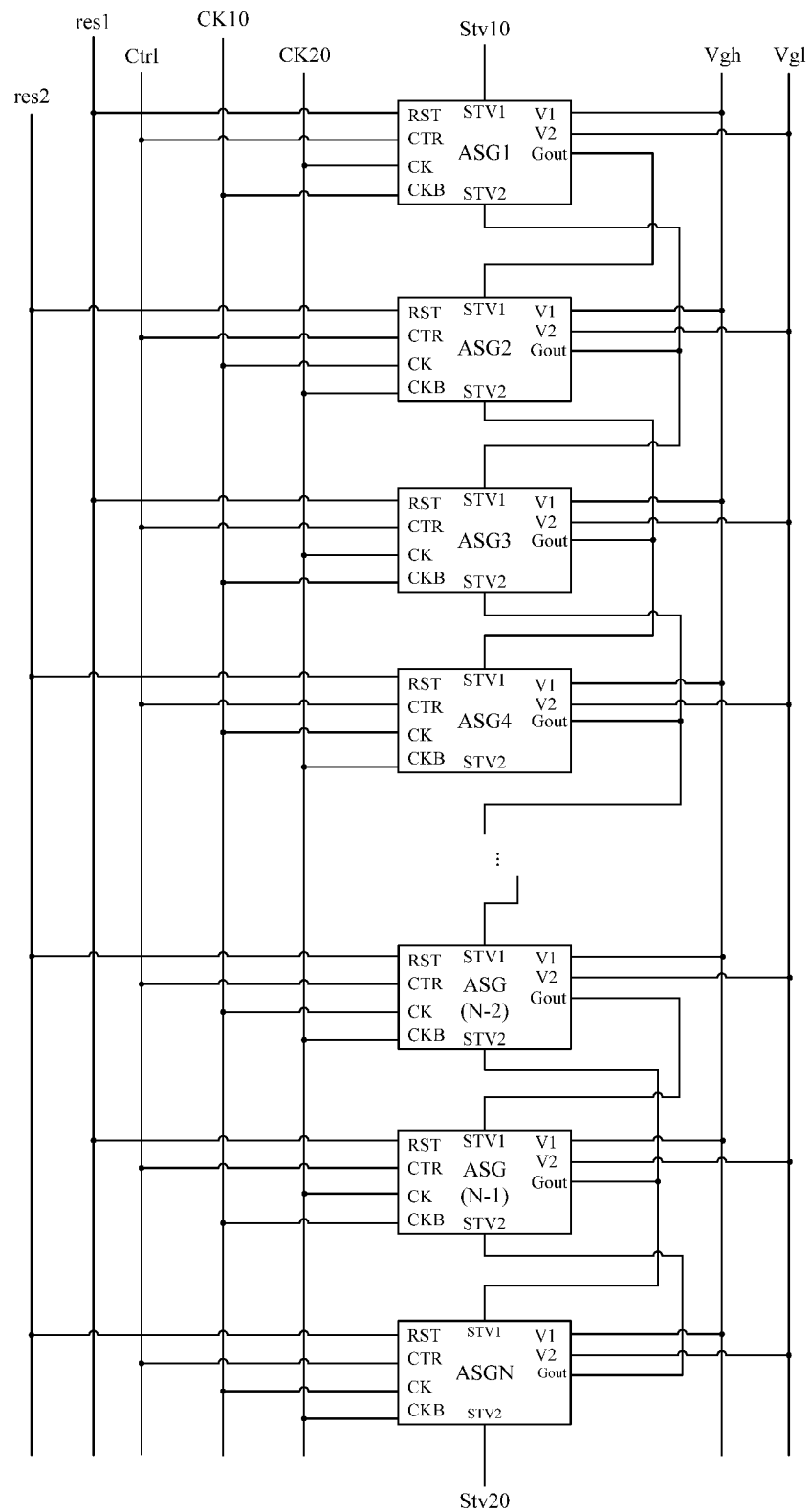
FIG. 5 illustrates a schematic view of an exemplary gate shift register according to the disclosed embodiments.

Further, FIG. 5 illustrates a schematic view of an exemplary gate shift register according to the disclosed embodiments.

The gate shift register may include a first stage through N-th stage of sequentially cascaded gate shift register units ASG1, ASG2, ASG3, ASG4, . . . , ASG(N−2), ASG(N−1), and ASGN. In one embodiment, N is an even-numbered. The gate shift register may also include a trigger signal line Stv10, a termination signal line Stv20, a control signal line Ctrl, a first reset signal line res1, a second reset signal res2, a first level signal line Vgh, a second level signal line Vgl, a first clock signal line CK10, and a second clock signal line CK20.

The first level signal terminal V1 of each gate shift register unit may be electrically connected to the first level signal line Vgh. The second level signal terminal V2 of each gate shift register unit may be electrically connected to the second level signal line Vgl. The first control terminal CTR of each gate shift register unit may be electrically connected to the control signal line Ctrl.

The activation signal terminal STV1 of the first stage gate shift register unit ASG1 may be electrically connected to the trigger signal line Stv10. The activation signal terminal STV1 of each of the second stage through the N-th stage gate shift register units ASG2, ASG3, ASG4, . . . , ASG(N−2), ASG(N−1), ASGN may be electrically connected to the output terminal Gout of the gate shift register unit one stage preceding. That is, the activation signal terminal STV1 of any i-th stage gate shift register unit may be electrically connected to the output terminal Gout of (i−1)-th stage gate shift register unit, where i is an integer and 2≤i≤N The deactivation signal terminal STV2 of the N-th stage gate shift register unit may be electrically connected to the termination signal line Stv20. The deactivation signal terminal STV2 of each of the first through (C)-th stage gate shift register units ASG1, ASG2, SG3, ASG4, . . . , ASG(N−2), ASG(N−1) may be electrically connected to the output terminal Gout of gate shift register unit one stage succeeding. That is, the deactivation signal terminal STV2 of any j-th stage gate shift register unit may be electrically connected to the output terminal Gout of (j+1)-th stage gate shift register unit, where j is an integer and 1≤j≤N−1.

The first clock signal terminal CK of each of the even-numbered stage gate shift register units ASG2, ASG4, . . . , ASG(N−2), ASGN may be electrically connected to the first clock signal line CK10. The second clock signal terminal CKB of each of the even-numbered stage gate shift register units ASG2, ASG4, . . . , ASG(N−2), ASGN may be electrically connected to the second clock signal line CK20.

The first clock signal terminal CK of each of the odd-numbered stage gate shift register units ASG1, ASG3, . . . , ASG(N−1) may be electrically connected to the second clock signal line CK20. The second clock signal terminal CKB of each of the odd-numbered stage gate shift register units ASG1, ASG3, . . . , ASG(N−1) may be electrically connected to the first clock signal line CK10.

The reset signal terminal RST of each of the odd-numbered stage gate shift register units ASG1, ASG3, . . . , ASG(N−1) may be electrically connected to the first reset signal line res1. The reset signal terminal RST of each of the even-numbered stage gate shift register units ASG2, ASG4, . . . , ASG(N−2), ASGN may be electrically connected to the second reset signal line res2.

As shown in FIG. 5, in the gate shift register, the output signal at the output terminal of each of the second through (N−1)-th gate shift register units may serve as the activation signal for the preceding stage and the deactivation signal for the succeeding stage. Thus, at the same time that one stage gate shift register unit outputs a gate electrode shift signal, the preceding stage gate shift register unit may be disabled, and the succeeding stage gate shift register unit may be enabled, thus achieving a stage-by-stage shifting output of the gate signals.

Compared to existing gate shift register, in the disclosed gate shift register a control signal line may be introduced to be electrically connected to the first control terminal added to each gate shift register unit, and circuit elements that connect or disconnect the first level signal terminal from the first node under the control of first control terminal may be introduced to each gate shift register unit. The simple circuits may allow each gate shift register unit to output pulsed signals in the image holding phase. When integrated into display panels, an integrated driving circuit may not have to directly output a turn-on signal to the scanning lines, thereby simplifying the driving algorithm for the integrated driving circuit in the display panels, and reducing the power consumption.

The resent disclosure also provides a driving method for the gate shift register. The operation timing sequence of the gate shift register may include a data writing phase and an image holding phase.

At the data writing phase, a single pulse signal may be supplied to the trigger signal line Stv10. A third clock signal may be supplied to the first clock signal line CK10. A fourth clock signal may be supplied to the second clock signal line CK20. A first level signal may be supplied to the first level signal line Vgh. A second level signal may be supplied to the second level signal line Vgl. Each stage of the gate shift register units may sequentially output a single pulse scanning driving signal. A half first clock signal cycle delay may exist between the third clock signal and the fourth clock signal.

At the image holding phase, a single pulse reset signal may be sequentially supplied to the first reset signal line res1 and the second reset signal line res2, respectively. A first level signal may be supplied to the first level signal line Vgh. A second level signal may be supplied to the second level signal line Vgl. A clock signal may be supplied to the control signal line Ctrl. A single pulse clock signal may be sequentially supplied to the first clock signal line CK10 and the second clock signal line CK20. The odd-numbered stage gate shift register units and the even-numbered stage gate shift register units may sequentially output the single pulse driving signal.

Figure 6:
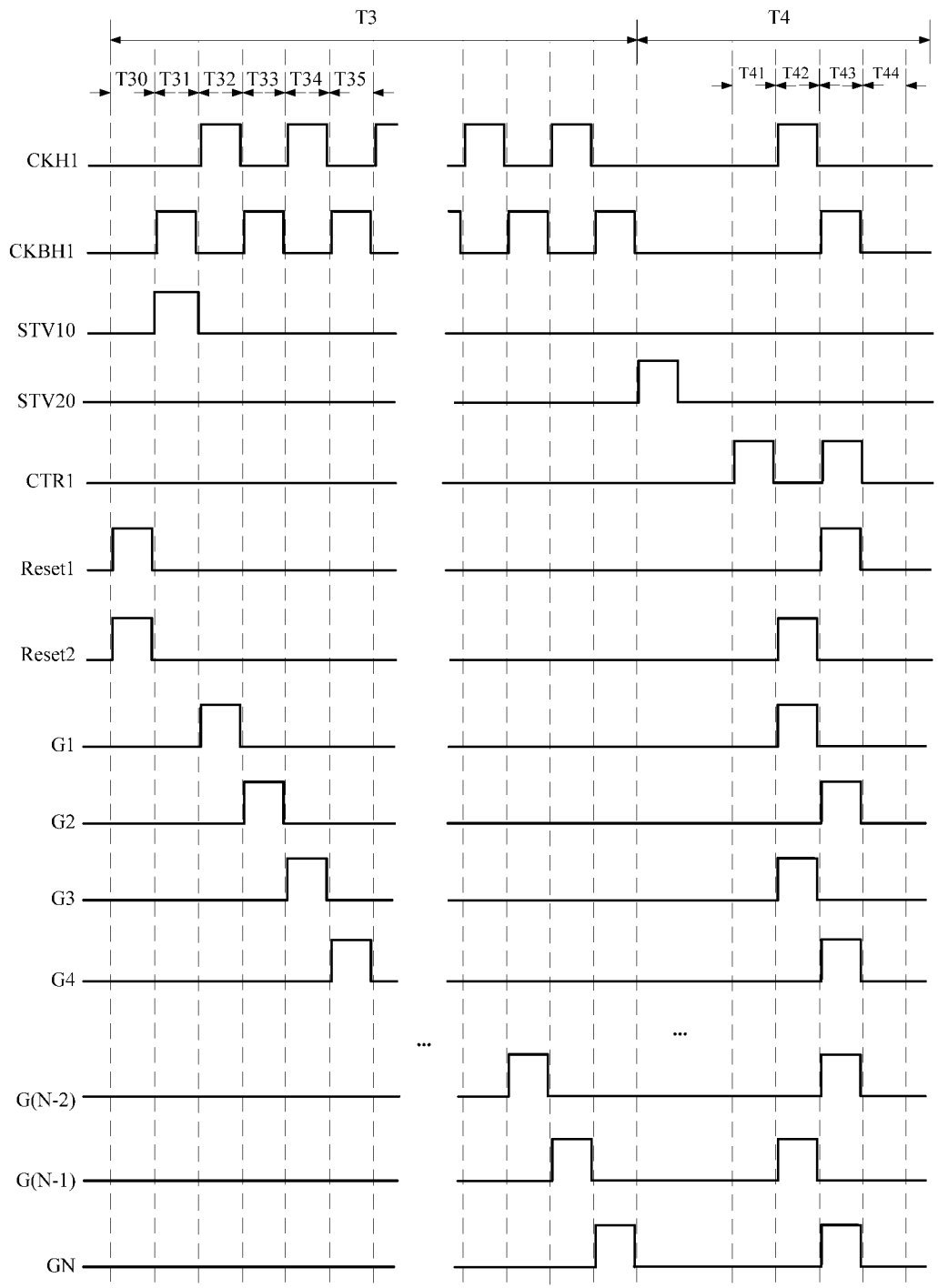
FIG. 6 illustrates a timing diagram of the exemplary gate shift register shown in FIG. 5.

FIG. 6 illustrates a timing diagram of the exemplary gate shift register shown in FIG. 5. Referring to FIG. 6, the operation principle of the gate shift register driven by the driving method according to the present disclosure may be further illustrated below in conjunction with the circuits of the gate shift register shown in FIG. 5 and the gate shift register unit shown in FIG. 3. As show in FIG. 6, CKH1, CKBH1, STV10, STV20, CTR1, Reset1, and Reset2 may be signals of the first clock signal line CK10, the second clock signal line CK20, the trigger signal line Stv10, the termination signal line Stv20, the control signal line Ctrl, the first reset signal line res1, and the second reset signal line res2, respectively. G1, G2, G3, G4, . . . , G(N−2), G(N−1), GN may be signals that the output terminals Gout of the first through the N-th stage shift register units output. In one embodiment, the transistors in the gate shift register may have a same channel type. The first level signal line may be input with a direct current first level signal. The first level signal may be a transistor turn-on signal. The second level signal line may be input with a direct current second level signal. The second level signal may be a transistor turn-off signal.

As shown in FIG. 6, the operation timing sequence of the gate shift register may include a data writing phase T3 and an image holding phase T4. The operation principle of the data writing phase T3 may be similar to the operation principle of the gate shift register unit illustrated in FIG. 4. The difference may be that the data writing phase T3 also includes a reset phase T30. At the reset phase T30, a first level signal (Reset1 and Reset2 are first level) may be supplied to the first reset signal line res1 and the second reset signal line res2, respectively. In each gate shift register unit, the sixth transistor M6 and the seventh transistor M7 may reset the signals at the first node N1 and the output terminal Gout to the signal at the second level signal terminal V2 (i.e., reset to the second level signal from the second level signal line Vgl).

The image holding phase T4 may include a first holding phase T41, a second holding phase T42, a third holding phase T43, and a fourth holding phase T44.

The driving method may further include the following.

At the first holding phase T41, a first level signal (Ctrl1 is high level) may be supplied to the control signal line Ctrl. A second level signal (Reset1, Reset2, CKH1, and CKBH1 are low level) may be supplied to the first reset signal line res1, the second reset signal line res2, the first clock signal line CK10, and the second clock signal line CK20. Accordingly, the fourth transistor M4 in each gate shift register unit may be turned on to transfer the first level signal at the first level signal line Vgh to the first node N1. The fifth transistor M5 in each gate shift register unit may be turned on to transfer the second level signal at the second level signal line Vgl to the second node N2. The eighth transistor M8 in each gate shift register unit may be turned on. The eighth transistors in the even-numbered stage gate shift register units may transfer the second level signal input from the second clock signal line CK20 to the output terminal Gout. The eighth transistor M8 in the odd-numbered stage gate shift register units may transfer the second level signal input from the first clock signal line CK10 to the output terminal Gout. Thus, the output terminal Gout in each gate shift register unit may output the second level signal (G1, G2, G3, G4, . . . , G(N−2), G(N−1), and GN are low level). The second capacitor C2 in each gate shift register unit may store electric charge to maintain a potential difference between the first node N1 and the output terminal Gout.

At the second holding phase T42, a second level signal (Ctrl1, Reset1, and CKBH1 are low level) may be supplied to the control signal line Ctrl, the first reset signal line res1, and the second clock signal line CK20. A first level signal (Reset2 and CHH1 are high level) may be supplied to the second reset signal line res2 and the first clock signal line CK10. Accordingly, the sixth transistor M6 and the seventh transistor M7 in each even-numbered stage gate shift register unit may be turned on under the control of the signal of the second reset signal line res2 to transfer the second level signal at the second level signal line Vgl to the second node N2 and the output terminal Gout (G2, G4, . . . , G(N−2), and GN are low level) in each even-numbered stage gate shift register unit. The second capacitor C2 in each odd-numbered stage gate shift register unit may discharge to the first node N1 to raise the potential at the first node N1. The eighth transistor M8 in each odd-numbered shift register unit may be turned on to transfer the first level signal at the first clock signal line CK10 received by the second clock signal line CK20 to the output terminal Gout in each odd-numbered stage gate shift register unit. Thus, the output terminal in each odd-numbered stage gate shift register unit may output the first level signal (G1, G3, . . . , and G(N−1) are high level). The output terminal Gout in each even-numbered gate shift register unit may output the second level signal (G2, G4, . . . , G(N−2), and GN are low level).

At the third holding phase T43, a first level signal (Ctrl1, Reset1, and CKBH1 are high level) may be supplied to the control signal line Ctrl, the first reset signal line res1, and the second clock signal line CK20. A second level signal (Reset2 and CKH1 are low level) may be supplied to the second reset signal line res2 and the first clock signal line CK10. Accordingly, the sixth transistor M6 and the seventh transistor M7 in each odd-numbered stage gate shift register unit may be turned on under the control of the signal at the first reset signal line res1 to transfer the second level signal at the second level signal line Vgl to the second node N2 and the output terminal Gout in each odd-numbered stage gate shift register unit. The fourth transistor M4 in each even-numbered stage gate shift register unit may be turned on under the control of the first level signal at the control signal line Ctrl to transfer the first level signal input from the first level signal line Vgh to the first node N1 in each even-numbered stage gate shift register unit, which may turn on the fifth transistor M5 and the eighth transistor M8 in each even-numbered stage gate shift register unit.

The fifth transistor in each even-numbered stage gate shift register unit may transfer the second level signal at the second level signal line Vgl to the second node N2. The second clock signal terminal CKB in each even-numbered stage gate shift register unit may receive the first level signal input from the second clock signal line CK20. The eighth transistor M8 in each even-numbered stage gate shift register unit may transfer the first level signal at the second clock signal terminal CKB to the output terminal Gout. The second capacitor C2 in each even-numbered stage gate shift register unit may store electric charge to maintain a potential difference between the first node N1 and the output terminal Gout. Thus, the output terminal in each odd-numbered stage gate shift register unit may output the second level signal (G1, G3, . . . , and G(N−1) are low level). The output terminal Gout in each even-numbered gate shift register unit may output the first level signal (G2, G4, . . . , G(N−2), and GN are high level).

At the fourth holding phase T44, a second level signal (Ctrl1, Reset1, Reset2, CKH1, and CKBH1 are low level) may be supplied to the control signal line Ctrl, the first reset signal line res1, the second reset signal line res2, the first clock signal line CK10, and the second clock signal line CK20. The output terminal Gout in each odd-numbered stage gate shift register unit may maintain the state at the preceding holding phase T43 and output the second level signal. The first node N1 in each even-numbered gate shift register unit may maintain a high level due to the discharge by the second capacitor C2. The eighth transistor M8 in each even-numbered stage gate shift register unit may be turned on to transfer the second level signal at the second clock signal line CK20 to the output terminal Gout. That is, the output terminal Gout in each stage gate shift register unit may output the second level signal (G1, G2, G3, G4, . . . , G(N−2), G(N−1), and GN are low level).

As shown in FIG. 6, the driving method according to the present disclosure may drive each stage gate shift register unit to sequentially output pulse signals at the data writing phase. At the image holding phase, the odd-numbered stage gate shift register units and the even-numbered stage gate shift register units may be driven to alternately output pulse signals. Thus, at the image holding phase, the scanning lines connected to the gate shift register units may transmit the pulse signals to the TFTs connected to pixels in a display region such that the characteristics drift of the TFTs due to being turned off for a prolonged period of time may be suppressed.

It should be noted that FIG. 6 only illustrates an operation timing sequence that each gate shift register unit outputs a single pulse signal at the image holding phase. In practical applications, based on a time threshold that a TFT remained in a turn-off state may cause characteristics drift, and a length of the image holding phase, the operation timing sequence of the driving method executed in the image holding phase including the first holding phase T41, the second holding phase T42, the third holding phase T43, and the fourth holding phase T44 may be designed to include a plurality of repetitions. For example, when the length of the image holding phase is t10, the time threshold that the TFT remains in a turn-off state triggering a characteristics drift is t20, $n*t20 \leq t10 \leq (n+1)*t20$, and n is a positive integer, the output terminal may need to output at least n number of pulse signals in the image holding phase t10. That is, the driving method may execute the operation timing sequence including T41-T44 shown in FIG. 6 for n number of times.

Figure 7:
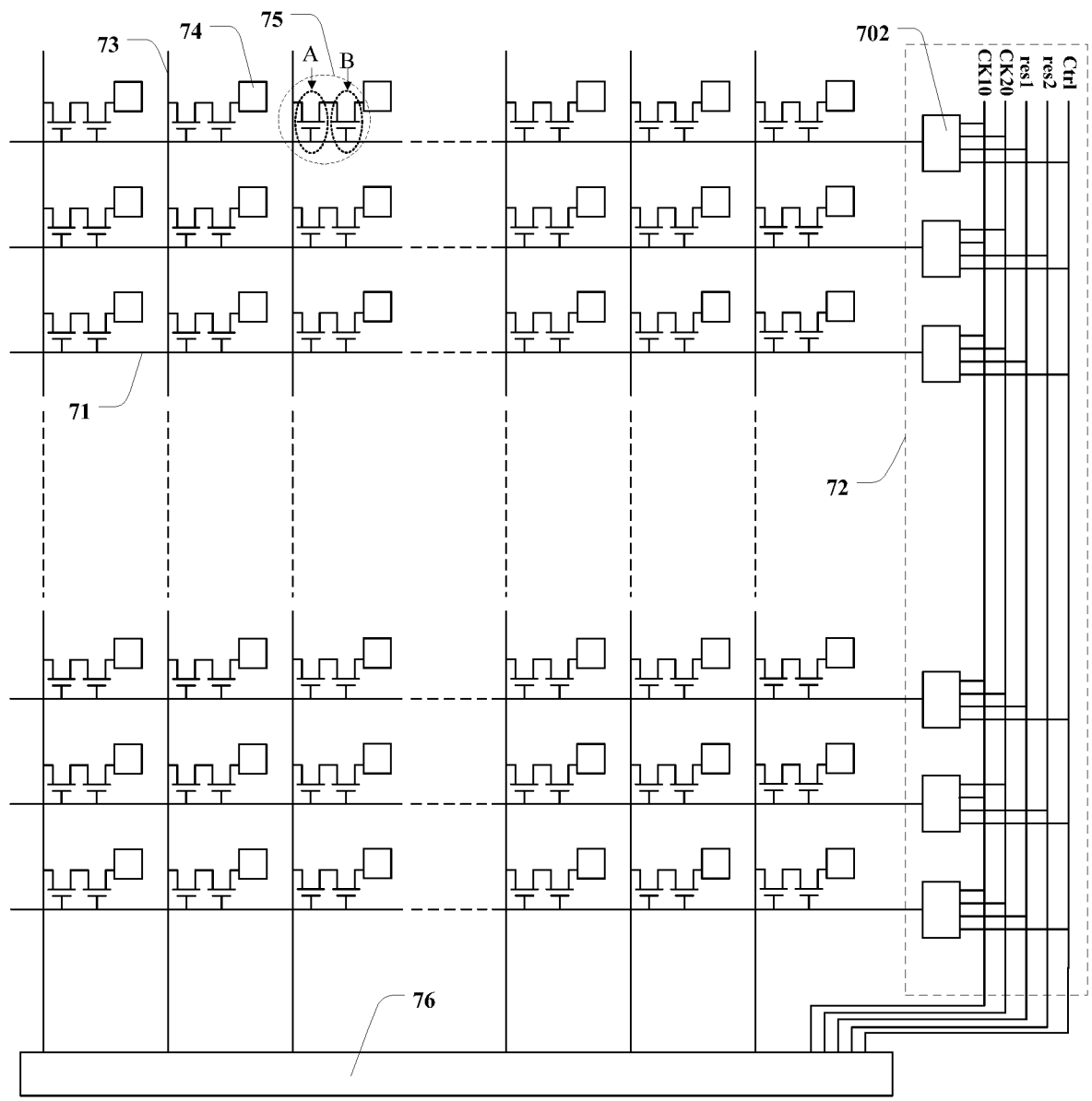
FIG. 7 illustrates a schematic view of an exemplary display panel according to the disclosed embodiments.

The present disclosure also provides a display panel. FIG. 7 illustrates a schematic view of an exemplary display panel according to the disclosed embodiments.

As shown in FIG. 7, the display panel may include a plurality of scanning lines 71 and a gate shift register 72. The gate shift register 72 may be any one of the disclosed gate shift registers. The gate shift register 72 may include a plurality of cascaded gate shift register units 702. Each scanning line 71 may be electrically connected to the output terminal of the corresponding gate shift register unit 702 in the gate shift register 72.

The display panel may also include a plurality of data lines 73 intersecting or crossing the scanning lines 71, a plurality of pixel units 74 arranged in an array, a plurality of TFT sets 75 arranged in an array and one-to-one corresponding to the plurality of pixel units 74, and an integrated driving circuit 76.

Each TFT set 75 may include two TFTs: a TFT A and a TFT B. A second electrode of the TFT A may be electrically connected to a first electrode of TFT B. Each pixel unit 74 may be electrically connected to a second electrode of the TFT B in the corresponding TFT set 75. The first electrodes of the TFTs A in a same column of the TFT sets 75 may be electrically connected to a data line 73. The gate electrodes of the TFTs A and the gate electrodes of the TFTs B in a same row of TFT sets 75 may be electrically connected to a same scanning line 71.

The integrated driving circuit 76 may be electrically connected to the data lines 73 and the gate shift register 72. In particular, the integrated riving circuit 76 may be electrically connected to the trigger signal line Stv10, the termination signal line Stv20, the control signal line Ctrl, the first reset signal line res1, the second reset signal line res2, the first level signal line Vgh, the second level signal line Vgl, the first clock signal line CK10, and the second clock signal line CK20.

The integrated driving circuit 76 may provide the corresponding driving signals to the respective signal lines in the gate shift register according to the operation timing sequence shown in FIG. 6. To change the state of the TFTs in the image holding phase, the integrated driving circuit 76 may only have to add a timing sequence for driving the control signal line Ctrl to the existing driving timing sequence of the gate shift register. Compared to the method of electrically connecting to the scanning lines directly by the integrated driving circuit and supplying pulse signals to the scanning lines, in the disclosed display panel, the number of driving ports occupied on the integrated driving circuit may be effectively reduced and, meanwhile, the power consumption may be lowered.

Moreover, each pixel unit may be connected to the data line 73 through two TFTs, such that leakage currents of the TFTs may be reduced when each scanning line outputs a single pulse signal in the image display phase, the potential of the pixel unit may be stabilized in the image holding phase, and the display performance may be enhanced.

Figure 8A:
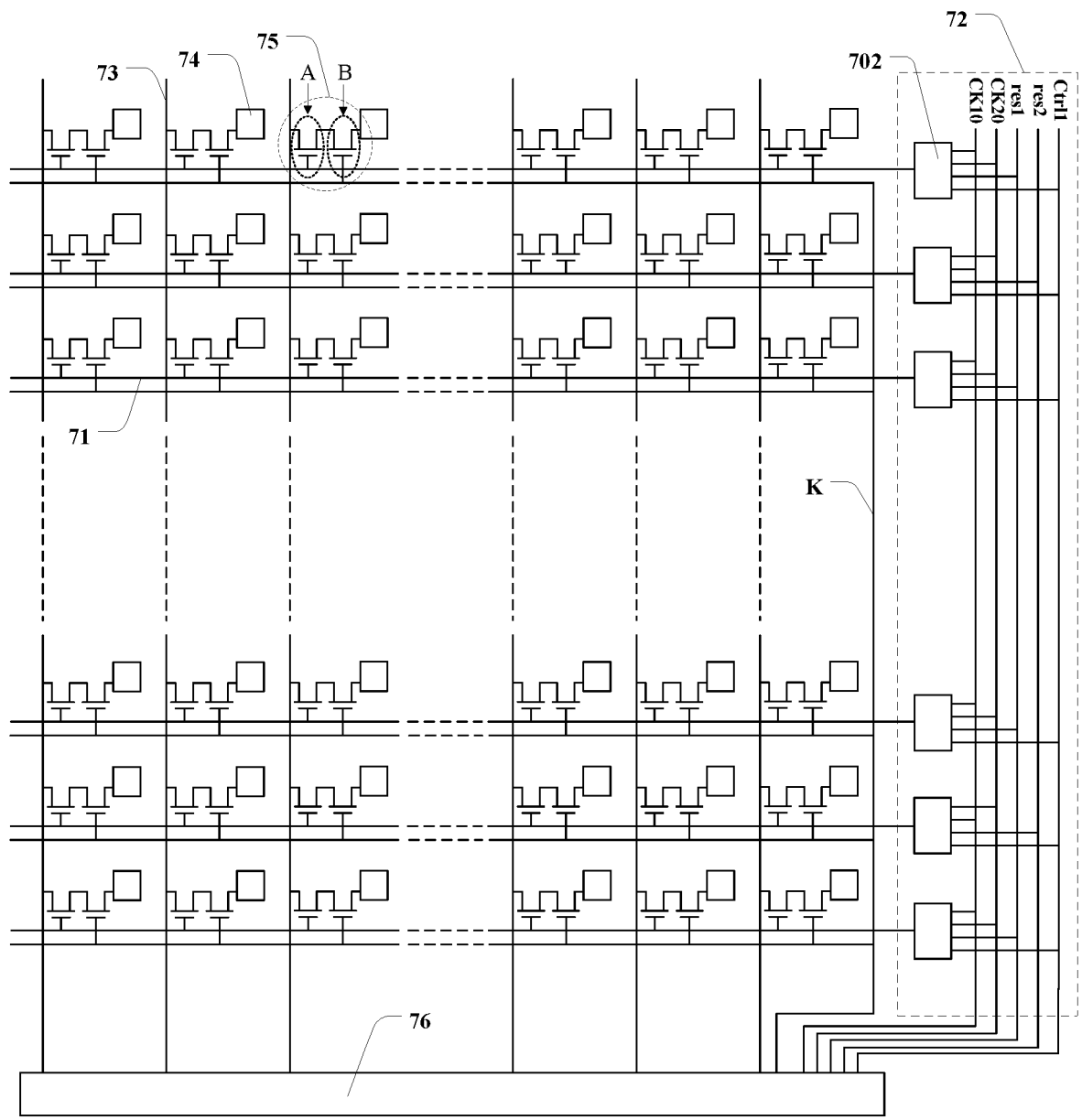
FIG. 8a illustrates a schematic view of another exemplary display panel according to the disclosed embodiments.
Figure 8B:
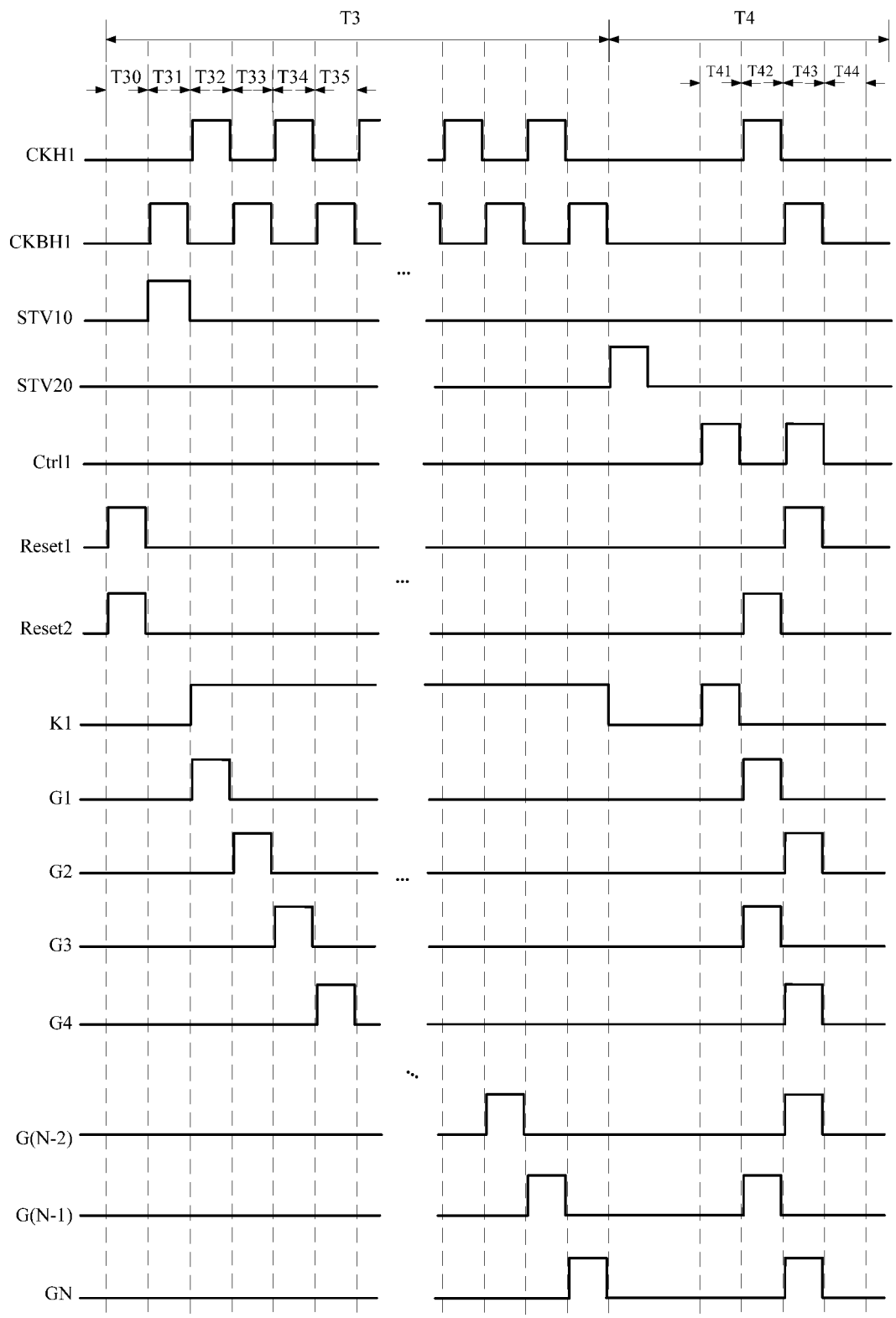

FIG. 8a illustrates a schematic view of another exemplary display panel according to the disclosed embodiments. FIG. 8b illustrates a timing diagram of the exemplary display panel shown in FIG. 8a.

As shown in FIG. 8a, different from the display panel shown in FIG. 7, the display panel shown in FIG. 8a may also include a second control signal line K. In the two TFTs A and B of each TFT set 75, a gate electrode of only the TFT A may be electrically connected to a scanning line 71, while a gate electrode of TFT B may be electrically connected to the second control signal line K. That is, charging and discharging process of each pixel unit 74 may be simultaneously controlled by signals at the scanning line 71 and the second control signal line K.

As shown in FIG. 8b, K1 may represent a signal at the second control signal line K. In one embodiment, different from the driving method (FIG. 6) for the display panel shown in FIG. 7, at an image display phase T1, a first level signal (K1 is high level) may be supplied to the second control signal line K, such that the TFT B electrically connected to the second control signal line K may remain in a turn-on state. Thus, at an image display phase T3, charging of each pixel unit may not be affected by the second control signal line K, instead, may be determined by the output signals G1, G2, G3, G4, . . . , G(N−2), G(N−1), GN at the output terminal of the gate shift register units.

Based on the driving method shown in FIG. 6, the driving method for the display panel shown in FIG. 8b may also include the following steps. At the second holding phase T42 and the third holding phase T43 of the image holding phase T4, a second level signal (K1 is low level at T42 and T43) may be supplied to the second control signal line K. Thus, on one hand, the characteristics drifting caused by each TFT A being controlled at a same level for a prolonged period of time may be prevented. On the other hand, in the image holding phase, when the TFT A is turned on, the TFT B in the same TFT set 75 may be turned off. Thus, a potential maintained at each pixel unit 74 may not decrease due to the leakage currents of the TFTs A and B. Accordingly, the pixel unit 74 may maintain a stable level at the image holding phase to ensure the display performance.

At the first phase T41 of the image holding phase T4, a first level signal (K1 is high level at T41) may be supplied to the second control signal line K. Thus, the second control signal line K may be configured to turn on the electrically connected TFT B while at the same time the TFT A in the same TFT set may be turned off. Thus, each TFT B may be turned on at the image holding phase T4 to prevent the characteristics drift of the TFT B. At the same time, when each TFT B is turned on and each TFT A is turned off, the potential at each pixel unit 74 may not decrease due to the leakage currents of the TFTs. Thus, the brightness of the displayed image may remain stable in the image holding phase, and brightness drift may be suppressed.

In one embodiment, at other phases of the image holding phase, a second level signal (K1 is low level at T41) may be supplied to the second control signal line K. Then each TFT A and each TFT B may be turned off.

The display panel may be a plasma display panel, a field emission display panel, a light-emitting diode (LED) display panel, an organic light-emitting diode (OLED) display panel, a liquid crystal display panel, a quantum dots (QDs) display panel, an electrophoretic display panel, etc. Further, the display panel may include any appropriate type of display panels capable of displaying videos and/or images.

In one embodiment, the display panel may be an electrophoretic display panel. In the electrophoretic display panel, the scanning frequency may be low. The image holding time may be longer than that of the LCD panel and the OLED display panel. Through adopting the disclosed gate shift register in the electrophoretic display panel, characteristics drift of the TFTs may effectively prevented, and the lifespan of the TFTs may be extended.

Figure 9:
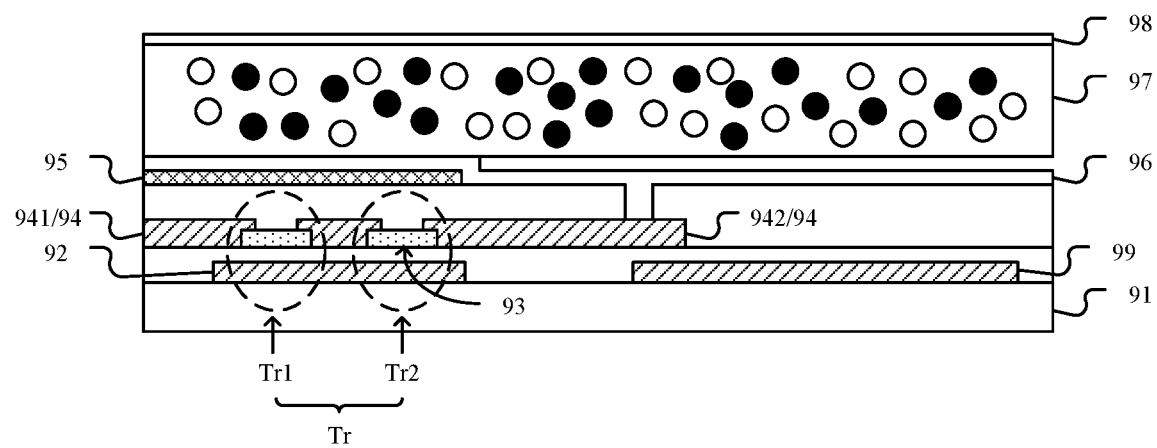
FIG. 9 illustrates a cross-sectional view of an exemplary electrophoretic display panel according to the disclosed embodiments.

FIG. 9 illustrates a cross-sectional view of an exemplary electrophoretic display panel according to the disclosed embodiments.

As shown in FIG. 9, the electrophoretic display panel 900 may include a substrate 91 and a plurality of TFTs (FIG. 9 only shows one TFT) formed on the substrate 91. The TFT may include a gate electrode 92, an active layer 93, a source electrode 941 and a drain electrode 942. A channel Tr of the TFT may be formed in the active layer 93. In one embodiment, the TFT may have a dual-gate structure, and may have two channels Tr1 and Tr2. The source electrode 941 and the drain electrode 942 may be disposed in a source-drain electrode layer 94.

A light shielding layer 95, a pixel electrode 96, an electrophoretic film 97, and a common electrode 98 may be sequentially formed on the source-drain electrode layer 94. The pixel electrode 96 and the drain electrode 942 may be electrically connected. The electrophoretic film 97 may contain electrophoretic particles. The electrophoretic display panel 900 may also include a common signal line 99 that is electrically connected to the common electrode 98. The common signal line 99 may be coplanar with the gate electrode 92. The common signal line 99 may form a storage capacitor with the metal of the source-drain electrode layer 94 to store charges at the pixel electrode 96 at the image holding phase, such that the electrophoretic display panel may continue to display images at the image holding phase.

The electrophoretic display panel is often used for low power consumption and low frequency scanning applications, such as billboards installed in public places, electronic displays in exhibition halls, and electronic newspapers. In these applications, the image scanning frequency may be substantially low. An image may be displayed for a prolonged period of time before being updated to display the next image. That is, the time interval for changing images may be substantially long. After the pixels are charged in the display phase, the display panel may experience a long image holding phase. The disclosed electrophoretic display panel may enhance the brightness, saturation, and contrast of the displayed images, improve the image performance, and extend the lifespan of the TFTs.

Figure 10:
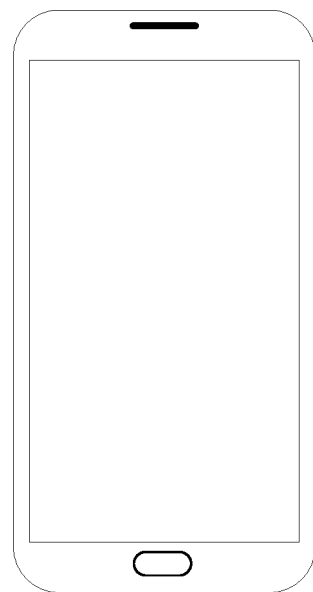
FIG. 10 illustrates a schematic view of an exemplary display apparatus according to the disclosed embodiments.

The present disclosure also provides a display apparatus. As shown in FIG. 10, the display apparatus 1000 may include any one of disclosed display panels. The display apparatus 1000 may be a smart phone, a tablet computer, or a wearable device, etc. It should be understood that the display apparatus 1000 may also include a substrate, a protective glass, and other well-known structures, which will not be described here.

The present disclosure provides the gate shift register unit, the gate shift register, the driving methods thereof, the display panel, and the display apparatus. By configuring a first control terminal, the gate shift register unit controls the level signal at the first node, and the first node controls the output unit to output a turn-on signal. Thus, the characteristics drifting due to the TFTs being turned off for a prolonged period of time at the image holding phase may be resolved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A gate shift register unit, comprising:
   an activation signal terminal and a deactivation signal terminal;
   a reset signal terminal;
   a first level signal terminal and a second level signal terminal;
   a first control terminal;
   a first clock signal terminal and a second clock signal terminal;
   an output terminal;
   a first node and a second node;
   a first node control unit electrically connected to the first control terminal, the activation signal terminal, the first level signal terminal, the second level signal terminal, the deactivation signal terminal, the first node, and the second node, and configured to transfer a signal at the first level signal terminal or at the second level signal terminal to the first node under a control of potential signals at the activation signal terminal, the deactivation signal terminal, the first control terminal, and the second node, wherein
   the first node control unit includes a transistor, and
   the transistor is electrically connected to the first level signal terminal, the first control terminal, and the first node;
   a second node control unit electrically connected to the second level signal terminal, the second clock signal terminal, the first node, and the second node, and configured to transfer a signal at the second level signal terminal or at the second clock signal terminal to the second node under a control of a potential signal at the first node;
   a reset unit electrically connected to the reset signal terminal, the second level signal terminal, the first node, and the output terminal, and configured to reset signals at the first node and the output terminal under a control of a potential signal at the reset signal terminal; and
   an output unit electrically connected to the first clock signal terminal, the second clock signal terminal, the second level signal terminal, the first node, the second node, and the output terminal, and configured to transfer a signal at the first level signal terminal, the second level signal terminal, or the second clock signal terminal to the output terminal under a control of the first clock signal terminal, the first node, and the second node.

2. The gate shift register unit according to claim 1, wherein:
   the first node control unit includes a writing control unit and an image holding control unit, the image holding control unit including the transistor;

the writing control unit is electrically connected to the activation signal terminal, the first level signal terminal, the deactivation signal terminal, the second level signal terminal, the second node, and the first node, and is configured to transfer a signal at the first level signal terminal to the first node under the control of the potential signal at the activation signal terminal at a data writing phase, and to transfer a signal at the second level signal terminal to the first node under the control of the potential signals at the deactivation signal terminal and the second node; and the image holding control unit is configured to transfer a signal at the first level signal terminal to the first node under the control of the potential signal at the first control terminal at an image holding phase.

3. The gate shift register unit according to claim 2, wherein:

the writing control unit includes a first transistor, a second transistor, and a third transistor;

a gate electrode of the first transistor is electrically connected to the activation signal terminal, a first electrode of the first transistor is electrically connected to the first level signal terminal, and a second electrode of the first transistor is electrically connected to the first node;

a gate electrode of the second transistor is electrically connected to the second node, a first electrode of the second transistor is electrically connected to the second level signal terminal, and a second electrode of the second transistor is electrically connected to the first node; and a gate electrode of the third transistor is electrically connected to the deactivation signal terminal, a first electrode of the third transistor is electrically connected to the second level signal terminal, and a second electrode of the third transistor is electrically connected to the first node.

4. The gate shift register unit according to claim 3, wherein:

a gate electrode of the transistor is electrically connected to the first control terminal, a first electrode of the transistor is electrically connected to the first level signal terminal, and a second electrode of the transistor is electrically connected to the first node.

5. The gate shift register unit according to claim 4, wherein:

the second node control unit includes a fifth transistor and a first capacitor;

a gate electrode of the fifth transistor is electrically connected to the first node, a first electrode of the fifth transistor is electrically connected to the second level signal terminal, and a second electrode of the fifth transistor is electrically connected to the second node; and the first capacitor includes a first electrode plate and a second electrode plate, the first electrode plate of the first capacitor is electrically connected to the second clock signal terminal, and the second electrode plate of the first capacitor is electrically connected to the second node.

6. The gate shift register unit according to claim 5, wherein:

the reset unit includes a sixth transistor and a seventh transistor;

a gate electrode of the sixth transistor is electrically connected to the reset signal terminal, a first electrode of the sixth transistor is electrically connected to the second level signal terminal, and a second electrode of the sixth transistor is electrically connected to the output terminal; and a gate electrode of the seventh transistor is electrically connected to the reset signal terminal, a first electrode of the seventh transistor is electrically connected to the second level signal terminal, and a second electrode of the seventh transistor is electrically connected to the first node.

7. The gate shift register unit according to claim 6, wherein:

the output unit includes an eighth transistor, a ninth transistor, a tenth transistor, and a second capacitor;

a gate electrode of the eighth transistor is electrically connected to the first node, a first electrode of the eighth transistor is electrically connected to the second clock signal terminal, and a second electrode of the eighth transistor is electrically connected to the output terminal; and a gate electrode of the ninth transistor is electrically connected to the second node, a first electrode of the ninth transistor is electrically connected to the second level signal terminal, and a second electrode of the ninth transistor is electrically connected to the output terminal;

a gate electrode of the tenth transistor is electrically connected to the first clock signal terminal, a first electrode of the tenth transistor is electrically connected to the second level signal terminal, and a second electrode of the tenth transistor is electrically connected to the output terminal; and the second capacitor includes a third electrode plate and a fourth electrode plate, the third electrode plate of the second capacitor is electrically connected to the first node, and the fourth electrode plate of the second capacitor is electrically connected to the output terminal.

8. The gate shift register unit according to claim 7, wherein:

the second transistor, the fifth transistor, the eighth transistor, and the ninth transistor have a same channel type; and the sixth transistor and the seventh transistor have a same channel type.

9. A driving method for a gate shift register unit comprising an activation signal terminal and a deactivation signal terminal; a reset signal terminal; a first level signal terminal and a second level signal terminal; a first control terminal; a first clock signal terminal and a second clock signal terminal; an output terminal; a first node and a second node; a first node control unit electrically connected to the first control terminal, the activation signal terminal, the first level signal terminal, the second level signal terminal, the deactivation signal terminal, the first node, and the second node, and configured to transfer a signal at the first level signal terminal or at the second level signal terminal to the first node under a control of potential signals at the activation signal terminal, the deactivation signal terminal, the first control terminal, and the second node; a second node control unit electrically connected to the second level signal terminal, the second clock signal terminal, the first node, and the second node, and configured to transfer a signal at the second level signal terminal or at the second clock signal terminal to the second node under a control of a potential signal at the first node; a reset unit electrically connected to the reset signal terminal, the second level signal terminal, the first node, and the output terminal, and configured to reset signals at the first node and the output terminal under a control of a potential signal at the reset signal terminal; and an output unit electrically connected to the first clock signal terminal, the second clock signal terminal, the second level signal terminal, the first node, the second node, and the output terminal, and configured to transfer a signal at the first level signal terminal, the second level signal terminal, or the second clock signal terminal to the output terminal under a control of the first clock signal terminal, the first node, and the second node, wherein:

an operation timing sequence of the gate shift register unit includes a data writing phase and an image holding phase;

at the data writing phase, a single pulse trigger signal is supplied to the activation signal terminal, a first clock signal is supplied to the first clock signal terminal, a second clock signal is supplied to the second clock signal terminal, a first level signal is supplied to the first level signal terminal, a second level signal is supplied to the second level signal terminal, a second level signal is supplied to the first control terminal, the output terminal of the gate shift register unit outputs a scanning driving signal, and a half first clock signal cycle delay exists between the first clock signal and the second clock signal; and at the image holding phase, a pulse signal is supplied to the first control terminal, another pulse signal is supplied sequentially to the first clock signal terminal and the second clock signal terminal, a first level signal is supplied to the first level signal terminal, a second level signal is supplied to the second level signal terminal, and the output terminal of the gate shift register unit outputs a single pulse signal.

10. A gate shift register, comprising a first stage to an N-th stage cascaded gate shift register units, wherein N is a positive integer greater than 1, and each gate shift register unit comprises:

an activation signal terminal and a deactivation signal terminal;
a reset signal terminal;
a first level signal terminal and a second level signal terminal;
a first control terminal;
a first clock signal terminal and a second clock signal terminal;
an output terminal;
a first node and a second node;
a first node control unit electrically connected to the first control terminal, the activation signal terminal, the first level signal terminal, the second level signal terminal, the deactivation signal terminal, the first node, and the second node, and configured to transfer a signal at the first level signal terminal or at the second level signal terminal to the first node under a control of potential signals at the activation signal terminal, the deactivation signal terminal, the first control terminal, and the second node, wherein
the first node control unit includes a transistor, and the transistor is electrically connected to the first level signal terminal, the first control terminal, and the first node;
a second node control unit electrically connected to the second level signal terminal, the second clock signal terminal, the first node, and the second node, and configured to transfer a signal at the second level signal terminal or at the second clock signal terminal to the second node under a control of a potential signal at the first node;
a reset unit electrically connected to the reset signal terminal, the second level signal terminal, the first node, and the output terminal, and configured to reset signals at the first node and the output terminal under a control of a potential signal at the reset signal terminal; and
an output unit electrically connected to the first clock signal terminal, the second clock signal terminal, the second level signal terminal, the first node, the second node, and the output terminal, and configured to transfer a signal at the first level signal terminal, the second level signal terminal, or the second clock signal terminal to the output terminal under a control of the first clock signal terminal, the first node, and the second node.

11. The gate shift register according to claim 10, further including:

a trigger signal line, wherein the activation signal terminal of the first stage gate shift register unit is electrically connected to the trigger signal line, and the activation signal terminal of any i-th stage gate shift register unit is electrically connected to the output terminal of an (i−1)-th stage gate shift register unit, where i is an integer and $2 \leq i \leq N$;

any i-th stage gate shift register unit may be electrically connected to the output terminal Gout of (i−1)-th stage gate shift register unit, where i is an integer and $2 \leq i \leq M$;

a termination signal line, wherein the deactivation signal terminal of the N-th stage gate shift register unit is electrically connected to the termination signal line, the deactivation signal terminal of any j-th stage gate shift register unit is electrically connected to the output terminal of a (j+1)-th stage gate shift register unit, where j is an integer and $1 \leq j \leq N-1$;

a control signal line, wherein the first control terminal of each gate shift register unit is electrically connected to the control signal line;

a first reset signal line and a second reset signal line, wherein the reset signal terminal of each odd-numbered stage gate shift register unit is electrically connected to the first reset signal line, and the reset signal terminal of each even-numbered stage gate shift register unit is electrically connected to the second reset signal line;

a first level signal line and a second level signal line, wherein the first level signal terminal of each gate shift register unit is electrically connected to the first level signal line, and the second level signal terminal of each gate shift register unit is electrically connected to the second level signal line; and a first clock signal line and a second clock signal line, wherein:
the first clock signal terminal of each even-numbered stage gate shift register unit is electrically connected to the first clock signal line, and the second clock signal terminal of each even-numbered stage gate shift register unit is electrically connected to the second clock signal line; and
the first clock signal terminal of each odd-numbered stage gate shift register unit is electrically connected to the second clock signal line, and the second clock signal terminal of each odd-numbered stage gate shift register unit is electrically connected to the first clock signal line.

12. A driving method for the gate shift register according to claim 11, wherein:
an operation timing sequence of the gate shift register includes a data writing phase and an image holding phase;
at the data writing phase, a single pulse trigger signal is supplied to the trigger signal line, a third clock signal is supplied to the first clock signal line, a fourth clock signal is supplied to the second clock signal line, a first level signal is supplied to the first level signal line, a second level signal is supplied to the second level signal line, each gate shift register unit sequentially outputs a single pulse scanning driving signal, and a half third clock signal cycle delay exists between the third clock signal and the fourth clock signal; and
at the image holding phase, a single pulse reset signal is supplied sequentially to the first reset signal line and the second reset signal line, a first level signal is supplied to the first level signal terminal, a second level signal is supplied to the second level signal terminal, a clock signal is supplied to the control signal line, a single pulse clock signal is supplied sequentially to first clock signal line and the second clock signal line, and each odd-numbered stage gate shift register unit and each even-numbered stage gate shift register unit sequentially output a single pulse driving signal.

13. The driving method according to claim 12, wherein:
the image holding phase includes a first holding phase, a second holding phase, a third holding phase, and a fourth holding phase;
at the first holding phase, a first level signal is supplied to the control signal line, a second level signal is supplied to the first reset signal line, the second reset signal line, the first clock signal line, and the second reset signal line, and the output terminal of each gate shift register unit outputs the second level signal;
at the second holding phase, the second level signal is supplied to the control signal line, the first reset signal line, and the second clock signal line, the first level signal is supplied to the second reset signal line and the first clock signal line, the output terminal of each odd-numbered stage gate shift register unit outputs the first level signal, and the output terminal of each even-numbered stage gate shift register unit outputs the second level signal;
at the third holding phase, the first level signal is supplied to the control signal line, the first reset signal line, and the second clock signal line, the second level signal is supplied to the second reset signal line and the first clock signal line, the output terminal of each odd-numbered stage gate shift register unit outputs the second level signal, and the output terminal of each even-numbered stage gate shift register unit outputs the first level signal; and
at the fourth holding phase, the second level signal is supplied to the control signal line, the first reset signal line, the second reset signal line, the first clock signal line, and the second clock signal line, and the output terminal of each stage gate shift register unit outputs the second level signal.

* * * * *